United States Patent
Kohda et al.

(10) Patent No.: US 10,211,144 B2
(45) Date of Patent: Feb. 19, 2019

(54) SEMICONDUCTOR DEVICE HAVING A PLURALITY OF TOP SURFACE CONNECTION TERMINALS

(71) Applicant: Panasonic Intellectual Property Management Co., Ltd., Osaka (JP)

(72) Inventors: Shinichi Kohda, Kyoto (JP); Junichi Kimura, Osaka (JP); Ryosuke Usui, Hokkaido (JP); Tomohide Ogura, Osaka (JP); Atsushi Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/580,457

(22) PCT Filed: Jul. 4, 2016

(86) PCT No.: PCT/JP2016/003180
§ 371 (c)(1),
(2) Date: Dec. 7, 2017

(87) PCT Pub. No.: WO2017/017901
PCT Pub. Date: Feb. 2, 2017

(65) Prior Publication Data
US 2018/0145020 A1 May 24, 2018

(30) Foreign Application Priority Data
Jul. 29, 2015 (JP) .................................. 2015-149111

(51) Int. Cl.
*H01L 23/50* (2006.01)
*H01L 23/36* (2006.01)
(Continued)

(52) U.S. Cl.
CPC .............. *H01L 23/50* (2013.01); *H01L 23/36* (2013.01); *H01L 23/48* (2013.01);
(Continued)

(58) Field of Classification Search
CPC ..... H01L 23/50; H01L 23/36; H01L 23/4951; H01L 23/49558; H01L 23/49562; H01L 23/49568; H01L 23/585
See application file for complete search history.

(56) References Cited

U.S. PATENT DOCUMENTS 7,057,298 B2 * 6/2006 Hirao ..................... H01L 23/051
257/625
8,319,333 B2 * 11/2012 Oka ......................... H01L 24/40
257/697

(Continued)

FOREIGN PATENT DOCUMENTS

CN 202695428 U 1/2013
JP 2000-156439 6/2000
(Continued)

OTHER PUBLICATIONS

International Search Report of PCT application No. PCT/JP2016/003180 dated Oct. 4, 2016.
(Continued)

*Primary Examiner* — Ida M Soward
(74) *Attorney, Agent, or Firm* — McDermott Will & Emery LLP (57) ABSTRACT

This semiconductor device includes a semiconductor element mounted on a metal layer, first to third connection terminals that are provided on the semiconductor element, a first bus bar bonded to the first connection terminal, and a second bus bar bonded to the second connection terminal. The semiconductor element is bonded to the metal layer, and the first to third connection terminals are disposed on a top
(Continued)

surface of the semiconductor element. One end of the first bus bar is bonded to the first connection terminal, another end of the first bus bar is an output unit, one end of the second bus bar is bonded to the second connection terminal, and another end of the second bus bar is bonded to the metal layer. A first surface of the semiconductor element and the second bus bar are at an identical potential.

7 Claims, 5 Drawing Sheets

(51) Int. Cl.
| | | |
|---|---|---|
| *H01L 23/49* | (2006.01) | |
| *H01L 23/58* | (2006.01) | |
| *H01L 23/48* | (2006.01) | |
| *H05K 7/20* | (2006.01) | |
| *H01L 23/00* | (2006.01) | |
| *H01L 23/495* | (2006.01) | |

(52) U.S. Cl.
CPC .... *H01L 23/4951* (2013.01); *H01L 23/49558* (2013.01); *H01L 23/49562* (2013.01); *H01L 23/49568* (2013.01); *H01L 23/585* (2013.01); *H01L 24/37* (2013.01); *H01L 24/40* (2013.01); *H05K 7/20* (2013.01); *H01L 2224/0603* (2013.01); *H01L 2224/37147* (2013.01); *H01L 2224/48091* (2013.01); *H01L 2224/73265* (2013.01); *H01L 2224/83801* (2013.01); *H01L 2224/84801* (2013.01)

(56) References Cited

U.S. PATENT DOCUMENTS

| | | | |
|---|---|---|---|
| 9,142,473 B2* | 9/2015 | Hung | H01L 23/3135 |
| 2002/0141214 A1 | 10/2002 | Grover | |
| 2004/0164400 A1* | 8/2004 | Meyer-Berg | H01L 23/49811 |
| | | | 257/693 |
| 2009/0127685 A1* | 5/2009 | Jong | H01L 23/4334 |
| | | | 257/676 |
| 2012/0069525 A1 | 3/2012 | Yang | |
| 2013/0181334 A1 | 7/2013 | Maruyama | |
| 2014/0001617 A1* | 1/2014 | Shi | H01L 24/32 |
| | | | 257/676 |
| 2014/0299979 A1 | 10/2014 | Danno et al. | |
| 2014/0374801 A1* | 12/2014 | Ikeda | H01L 23/492 |
| | | | 257/195 |
| 2017/0025337 A1* | 1/2017 | Padmanabhan | H01L 23/49575 |
| 2018/0005927 A1* | 1/2018 | Liu | H01L 23/49524 |
| 2018/0096922 A1* | 4/2018 | Chen | H01L 23/3114 |

FOREIGN PATENT DOCUMENTS

| | | |
|---|---|---|
| JP | 2001-332664 | 11/2001 |
| JP | 2004-096135 | 3/2004 |
| JP | 2007-243157 | 9/2007 |
| JP | 2011-129607 A | 6/2011 |
| JP | 2014-086536 | 5/2014 |
| WO | 2012/120930 | 9/2012 |

OTHER PUBLICATIONS

The Extended European Search Report dated Jul. 25, 2018 for the related European Patent Application No. 16830009.3.

* cited by examiner

FIG. 5
Prior Art

SEMICONDUCTOR DEVICE HAVING A PLURALITY OF TOP SURFACE CONNECTION TERMINALS This application is a U.S. national stage application of the PCT International Application No. PCT/JP2016/003180 filed on Jul. 4, 2016, which claims the benefit of foreign priority of Japanese patent application No. 2015-149111 filed on Jul. 29, 2015, the contents all of which are incorporated herein by reference

TECHNICAL FIELD

The present disclosure relates to a semiconductor device used for various electronic devices.

BACKGROUND ART

Figure 5:
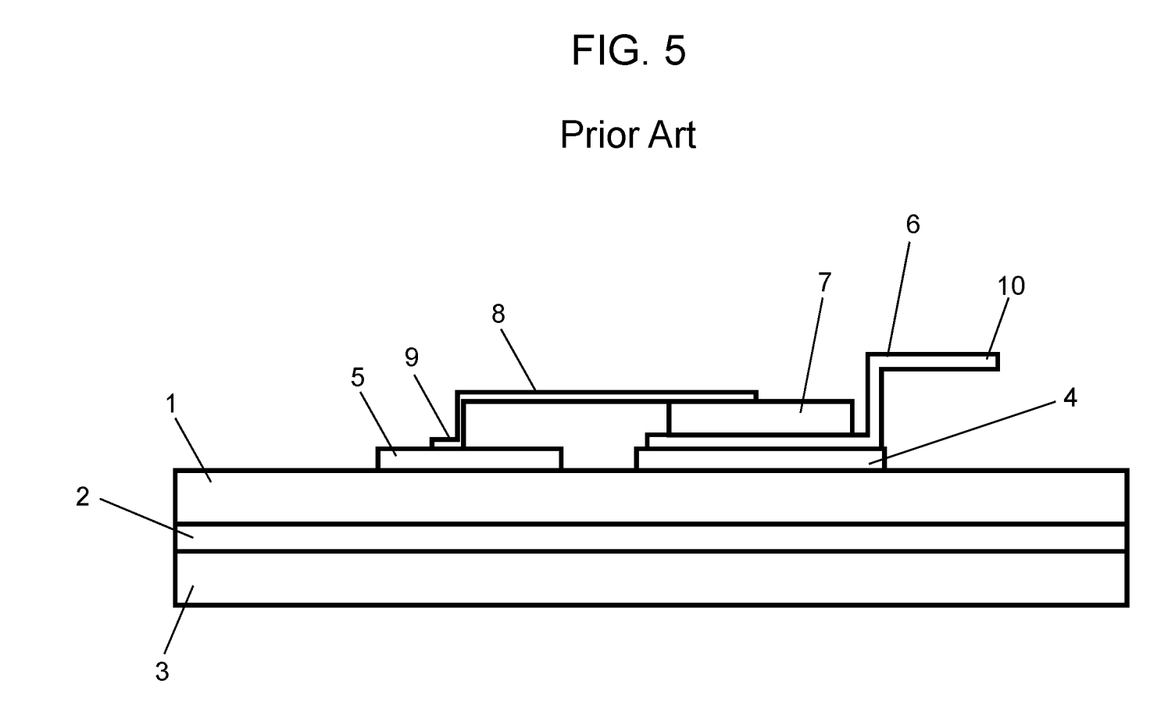
FIG. 5 is a side view illustrating a conventional semiconductor device.

A conventional semiconductor device will be described below with reference to the drawings. FIG. 5 is a side view illustrating a configuration of a conventional semiconductor device, wherein heat sink 3 is provided to base plate 1 with insulating layer 2 interposed therebetween. Insulators 4 and 5 are provided on a top surface of base plate 1. Heat sink 3 lies below insulating layer 2. Bus bar 6 is provided on insulator 4. Further, semiconductor element 7 is mounted on bus bar 6. One end of bus bar 8 is connected to a top surface of semiconductor element 7. Bus bar 8 extends from a joint portion with semiconductor element 7, and another end (end 9) of bus bar 8 lies on insulator 5 in close contact therewith. End 9 of bus bar 8 and end 10 of bus bar 6 function as a connection terminal for connection to the outside.

It should be noted that, for example, PTL 1 is known as a prior art document containing information related to the invention in this application.

CITATION LIST

Patent Literature

PTL 1: Unexamined Japanese Patent Publication No. 2007-243157

SUMMARY OF THE INVENTION

A semiconductor device according to the present disclosure includes: a metal layer which is a conductor, a semiconductor element mounted on a first surface of the metal layer, a first connection terminal provided on the semiconductor element, a second connection terminal provided on the semiconductor element, a third connection terminal provided on the semiconductor element, a first bus bar bonded to the first connection terminal, and a second bus bar bonded to the second connection terminal. A first surface of the semiconductor element is bonded to the first surface of the metal layer; the first connection terminal, the second connection terminal, and the third connection terminal are disposed on a second surface of the semiconductor element; one end of the first bus bar is bonded to the first connection terminal; another end of the first bus bar is an output unit; one end of the second bus bar is bonded to the second connection terminal; another end of the second bus bar is bonded to the metal layer; and the first surface of the semiconductor element and the second bus bar are at an identical potential.

DESCRIPTION OF EMBODIMENTS

Prior to describing exemplary embodiments of the present disclosure, problems of the conventional semiconductor device will be briefly described.

In the conventional semiconductor device described with reference to FIG. 5, heat generated by operation of semiconductor element 7 is transmitted to base plate 1 through bus bar 6 and insulator 4 or through bus bar 8 and insulator 5. However, heat conductivity from semiconductor element 7 to base plate 1 is deteriorated due to the presence of insulator 4 and insulator 5. Accordingly, the conventional semiconductor device has a problem of a possibility of insufficient heat dissipation from semiconductor element 7.

Exemplary embodiments of the present disclosure will now be described with reference to the accompanying drawings.

In the description of the present disclosure, terms indicating directions, such as a "top surface", "bottom surface", "upper side", and "lower side" are used for facilitating the description. However, the terms indicating directions such as a "top surface", "bottom surface", "upper side", and "lower side" merely indicate a relative positional relation, and do not limit directions to those indicated by these terms.

First Exemplary Embodiment

Figure 1:
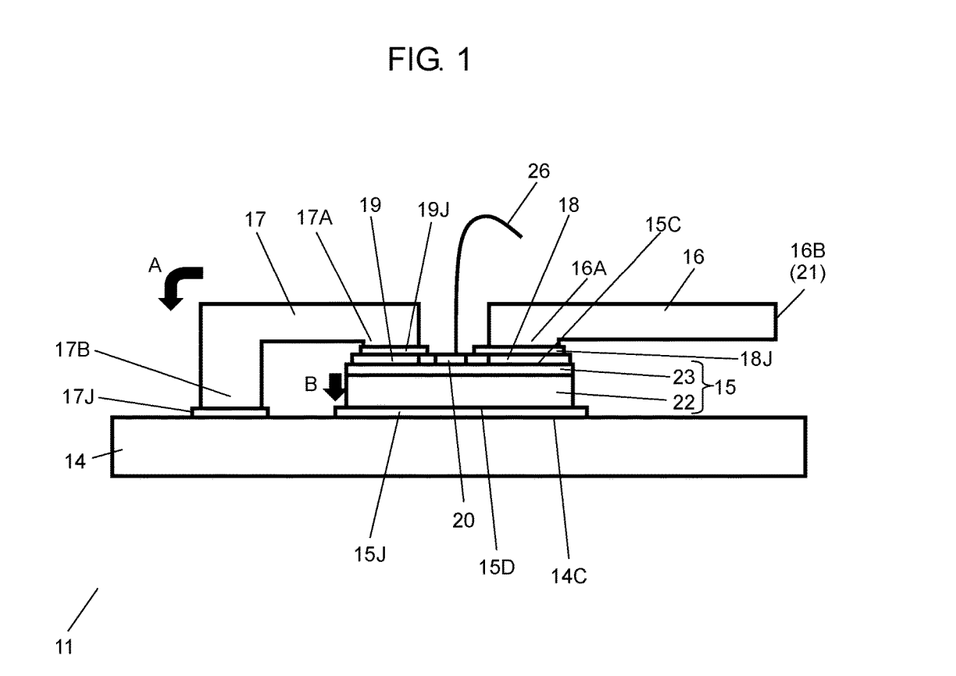
FIG. 1 is a side view illustrating a configuration of a semiconductor device according to a first exemplary embodiment of the present disclosure.

FIG. 1 is a side view illustrating a configuration of a semiconductor device according to a first exemplary embodiment of the present disclosure. Semiconductor device 11 includes metal layer 14, semiconductor element 15, bus bar 16, and bus bar 17.

The metal layer 14 is a conductor. Semiconductor element 15 is mounted on a top surface of metal layer 14. The surface of metal layer 14 on which semiconductor element 15 is mounted is referred to as mounting surface 14C. Connection terminal 18, connection terminal 19, and connection terminal 20 are provided on top surface 15C of semiconductor element 15. Connection terminal 18 is connected to one end 16A of bus bar 16, and connection terminal 19 is connected to one end 17A of bus bar 17.

Another end 16B of bus bar 16 is output unit 21, and another end 17B of bus bar 17 is bonded to metal layer 14. Mounting surface 15D of semiconductor element 15 (surface of semiconductor element 15 mounted on metal layer 14) and bus bar 17 are at an identical potential.

According to the configuration described above, heat generated from top surface 15C opposite to mounting surface 15D of semiconductor element 15 (particularly heat generated on connection terminal 18 and connection terminal 19) is conducted to the outside of semiconductor device 11 or to another device (not illustrated) disposed separately from semiconductor element 15 through bus bar 16 and output unit 21 only by way of a conductor having high heat conductivity. In addition, heat generated on top surface 15C of semiconductor element 15 is conducted to metal layer 14 through bus bar 17 only by way of a conductor having high heat conductivity. Mounting surface 15D of semiconductor element 15 and bus bar 17 are at the identical potential. Therefore, it is unnecessary to electrically insulate mounting surface 15D of semiconductor element 15 from metal layer 14. Mounting surface 15D of semiconductor element 15 and joint section 17J between bus bar 17 and metal layer 14 can be disposed to be closely adjacent to each other.

Thus, bus bar 17 can be formed to be short in shape, so that the thermal resistance of bus bar 17 can be reduced. Heat generated from semiconductor element 15, particularly generated on connection terminal 19, is efficiently conducted to metal layer 14, and thus heat dissipation property of semiconductor element 15 is improved.

It should be noted that semiconductor element 15 is not limited to an insulated gate bipolar transistor (IGBT), a metal-oxide-semiconductor field-effect transistor (MOSFET), a gate injection transistor (GIT), or a silicon semiconductor. A gallium nitride semiconductor (GaN semiconductor) or a silicon carbide semiconductor (SiC semiconductor) may also be used for semiconductor element 15.

Figure 2:
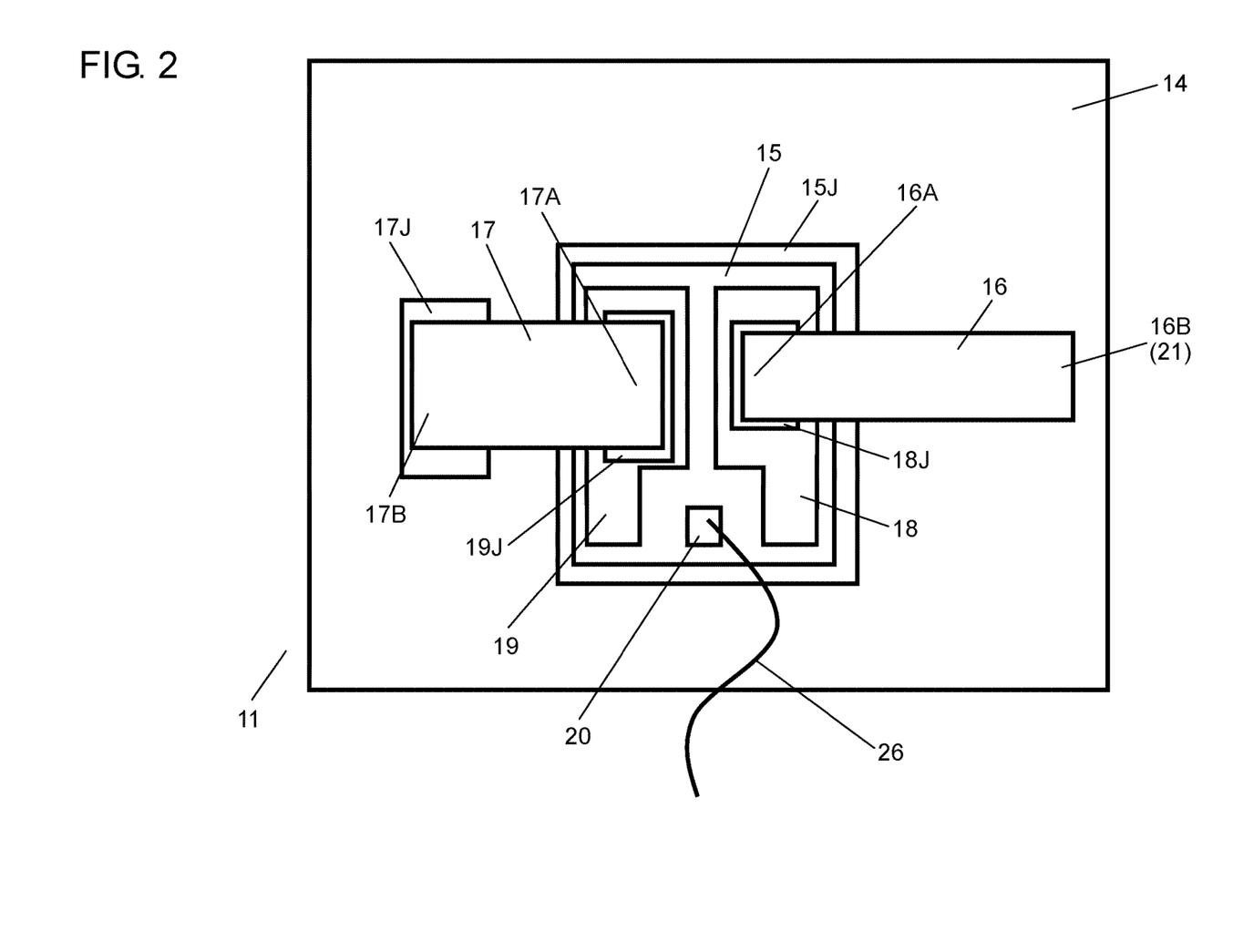
FIG. 2 is a top view illustrating the configuration of the semiconductor device according to the first exemplary embodiment of the present disclosure.

Semiconductor device 11 will now be described in more detail below. FIG. 2 is a top view illustrating the configuration of the semiconductor device according to the present exemplary embodiment of the present disclosure.

Connection terminal 18, connection terminal 19, and connection terminal 20 are provided so as to be gathered on top surface (upper surface in FIG. 1) of semiconductor element 15. Semiconductor element 15 is mounted on one surface (mounting surface 14C) of metal layer 14 by joint section 15J. Joint section 15J is a thin solder layer. Connection terminal 18 is connected to one end 16A of bus bar 16 by joint section 18J, and connection terminal 19 is connected to one end 17A of bus bar 17 by joint section 19J. Another end 17B of bus bar 17 is bonded to metal layer 14 by joint section 17J. Joint sections 17J, 18J, and 19J are formed by solder. Semiconductor element 15 and bus bar 17 are electrically connected to each other with joint section 15J, metal layer 14, and joint section 17J interposed therebetween, so that semiconductor element 15 and bus bar 17 are at the identical potential.

Specifically, semiconductor device 11 according to the present disclosure includes metal layer 14 which is a conductor, semiconductor element 15 mounted on mounting surface 14C of metal layer 14, connection terminals 18, 19, and 20 provided on semiconductor element 15, bus bar 16 bonded to connection terminal 18, and bus bar 17 bonded to connection terminal 19. A first surface (mounting surface 15D) of semiconductor element 15 is bonded to metal layer 14, and connection terminals 18, 19, and 20 are disposed on a second surface (top surface 15C) of semiconductor element 15. One end 16A of bus bar 16 is bonded to connection terminal 18, and another end 16B of bus bar 16 is an output unit. One end 17A of bus bar 17 is bonded to connection terminal 19, and another end 17B of bus bar 17 is bonded to metal layer 14. The first surface (mounting surface 15D) of semiconductor element 15 and bus bar 17 are at the identical potential.

Note that semiconductor element 15 and metal layer 14 are bonded to each other with joint section 15J interposed therebetween. Bus bar 16 and connection terminal 18 are bonded to each other with joint section 18J interposed therebetween. Bus bar 17 and connection terminal 19 are bonded to each other with joint section 19J interposed therebetween. Bus bar 17 and metal layer 14 are bonded to each other with joint section 17J interposed therebetween.

In other words, connection terminal 19 generally corresponding to a heat generating region is electrically and thermally connected to metal layer 14 with joint section 19J, bus bar 17, and joint section 17J interposed therebetween. Heat conduction path A (indicated by an arrow in FIG. 1) constituted by joint section 19J, bus bar 17, and joint section 17J connects metal layer 14 and connection terminal 19 without an insulating material interposed therebetween. In general, an insulating material has low heat conductivity, and if the insulating material is present in a heat conduction path, the thermal resistance of the heat conduction path increases. Heat conduction path A is constituted only by metal having high heat conductivity. Therefore, heat conduction from connection terminal 19 to metal layer 14 through bus bar 17 is excellent, and thus heat generated from semiconductor element 15 is efficiently conducted to metal layer 14 and heat dissipator 12 (see FIG. 3) through heat conduction path A.

In addition, connection terminal 19 is thermally connected to metal layer 14 with substrate 22 of semiconductor element 15 and joint section 15J interposed therebetween. Substrate 22 has a higher thermal resistance per unit volume than bus bar 17, but it is formed to be thinner than bus bar 17. Therefore, heat conduction path B constituted by substrate 22 and joint section 15J also has a low thermal resistance. Accordingly, heat conduction from connection terminal 19 to metal layer 14 through substrate 22 is excellent, and thus heat generated from semiconductor element 15 is efficiently conducted to metal layer 14 through heat conduction path B.

On the other hand, connection terminal 18 is connected to one end 16A of bus bar 16 with joint section 18J interposed therebetween. As previously stated, another end 16B of bus bar 16 corresponds to output unit 21, and is connected to the outside of semiconductor device 11 or another device (not illustrated) disposed separately from semiconductor element 15. Therefore, heat generated from semiconductor element 15 is also dissipated to the outside of semiconductor element 15 even through output unit 21.

If semiconductor device 11 is particularly provided for the purpose of power control, not only heat generated on connection terminal 18 and connection terminal 19 but also heat generated on bus bar 16 and bus bar 17 are increased due to a high current. Therefore, heat generation is concentrated on top surface 15C of semiconductor element 15.

To address such a situation, semiconductor device 11 has heat conduction path A where heat is conducted through bus bar 17 and heat conduction path B where heat is conducted through substrate 22 of semiconductor element 15 as described above. Heat conduction path A has a longer distance than heat conduction path B. However, heat conduction path A is entirely formed from metal and has a low thermal resistance per unit volume. Therefore, the thermal resistance of heat conduction path A as a whole is also low. Heat conduction path B having a region not formed from metal has a high thermal resistance per unit volume. However, heat conduction path B has a shorter distance than heat conduction path A, and thus, has a low thermal resistance as a whole.

According to the configuration described above, the region where heat dissipated from semiconductor element 15 and generated on bus bar 17 is conducted to metal layer 14 is distributed to a region that mounting surface 15D of semiconductor element 15 faces and a region that another end 17B of bus bar 17 faces. That is, an area of semiconductor element 15 for heat dissipation is increased, so that a configuration substantially equivalent to a configuration of cooling both surfaces can be obtained. Thus, heat dissipation efficiency is enhanced. Therefore, the stress concentration on joint section 15J or joint section 17J due to the temperature rise of semiconductor element 15 hardly occurs.

In addition, in the present exemplary embodiment, another end 17B of bus bar 17 and mounting surface 15D of semiconductor element 15 are at the identical potential. In other words, joint section 15J and joint section 17J are electrically connected to each other by metal layer 14. With this configuration, joint section 15J and joint section 17J can be disposed to be closely adjacent to each other, whereby thermal coupling between another end 17B of bus bar 17 and mounting surface 15D of semiconductor element 15 can be strengthened. Accordingly, as described above, in semiconductor device 11 according to the present disclosure, an area of semiconductor element 15 for heat dissipation is increased, so that a configuration substantially equivalent to a configuration of cooling both surfaces can be obtained. Consequently, heat dissipation efficiency of semiconductor device 11 is enhanced, and thus, an unbalanced temperature rise between joint section 15J and joint section 17J is prevented. Furthermore, joint section 15J and joint section 17J can be disposed to be closely adjacent to each other, and thus reduction in size and reduction in area of semiconductor device 11 are enabled.

Naturally, heat generated from semiconductor element 15 is distributed to joint section 15J and joint section 17J on metal layer 14, and thus, degradation in joint reliability of joint section 15J and joint section 17J is suppressed. Degradation of joint reliability of joint section 18J on one end 16A of bus bar 16 is also similarly suppressed because of heat distribution.

In the present exemplary embodiment, it is only necessary that metal layer 14 is formed from a conductive material, and it is desirable to use copper being excellent in both electric conductivity and heat conductivity for metal layer 14. In addition, metal layer 14 may be formed from a plurality of metals, and subjected to plating on the surface thereof.

Herein, semiconductor element 15 is preferably constituted by a gallium-based nitride transistor. Semiconductor element 15 using a gallium nitride-based transistor includes substrate 22 and nitride semiconductor layer 23. Substrate 22 is bonded to metal layer 14 by joint section 15J. Nitride semiconductor layer 23 lies on substrate 22, and metal layer 14 lies under substrate 22.

Substrate 22 may be a silicon substrate, a sapphire substrate, a silicon carbide substrate, a graphite substrate, a gallium oxide substrate, or a nitride semiconductor substrate, for example. Particularly, a silicon substrate is preferable.

Preferably, connection terminal 18 may be formed as a drain terminal, connection terminal 19 may be formed as a source terminal, and connection terminal 20 may be formed as a gate terminal. If semiconductor element 15 is a gallium nitride-based transistor, the drain terminal (connection terminal 18), the source terminal (connection terminal 19), and the gate terminal (connection terminal 20) are disposed on the top surface (top surface 15C of semiconductor element 15) of nitride semiconductor layer 23 having a thickness of about 5 μm to 10 μm as illustrated in FIG. 1.

When the gallium nitride-based transistor is operated, nitride semiconductor layer 23 generates heat. Therefore, heat generation on top surface 15C of semiconductor element 15 becomes significant. To address this situation, bus bar 16 is connected to connection terminal 18, and bus bar 17 is connected to connection terminal 19 to enable heat conduction to metal layer 14 and to the outside of semiconductor element 15. With this configuration, heat dissipation efficiency of semiconductor element 15 is improved.

Heat generated from nitride semiconductor layer 23 of semiconductor element 15 is also conducted to substrate 22 having a thickness of about 200 μm to 300 μm and to metal layer 14 through joint section 15J. Accordingly, as previously described, in semiconductor device 11 according to the present disclosure, an area of semiconductor element 15 for heat dissipation is increased, and therefore, a configuration substantially equivalent to a configuration of cooling both surfaces can be obtained. Thus, the heat dissipation efficiency is enhanced.

Further, a lateral transistor is formed by using the gallium nitride-based transistor. Therefore, a silicon substrate serving as substrate 22 and a source terminal (connection terminal 19) can easily be brought into a conduction state by bus bar 17 to be at the identical potential. That is, the electric field concentration near the gate terminal (connection terminal 20) can be prevented. This results in suppressing a current collapse phenomenon in which a high potential difference is caused between the drain terminal (connection terminal 18) and the source terminal (connection terminal 19), and then, an on resistance value between the drain terminal and the source terminal increases. In other words, a back field plate effect can be obtained. Thus, operational reliability of semiconductor device 11 is enhanced.

In the present exemplary embodiment, another end 17B of bus bar 17 is connected to metal layer 14 with joint section 17J interposed therebetween, and semiconductor element 15 is connected to metal layer 14 with joint section 15J interposed therebetween. Metal layer 14 may be a lead frame in which a predetermined wiring pattern is formed.

For example, it is supposed that a controller (not illustrated) thermally and electrically insulated from connection terminal 18 and connection terminal 19 and used for controlling semiconductor element 15 is connected to connection terminal 20. In this case, the controller (not illustrated) may be mounted on a portion of the lead frame (metal layer 14) in which the predetermined wiring pattern is formed. In this case, joint section 17J and joint section 15J are disposed to be closely adjacent to each other so as to be electrically and thermally coupled to each other.

With this configuration, connection terminal 20 and the controller (not illustrated) can be disposed to be close to each other. Therefore, semiconductor device 11 can be downsized. Further, due to connection terminal 20 and the controller (not illustrated) being disposed to be close to each other, control conductor 26 for connecting connection terminal 20 and the controller (not illustrated) is shortened. Therefore, control conductor 26 for connecting connection terminal 20 and the controller (not illustrated) is less affected by noise and hardly radiates noise to the outside, even if a frequency in the control performed by the controller (not illustrated) is high.

Consequently, semiconductor device 11 enables a large number of devices including semiconductor element 15 to be mounted thereon at a high density, and the operational reliability of semiconductor device 11 can be enhanced.

In this case as well, it is only necessary that the lead frame (metal layer 14) is formed from a conductive material, and it is desirable to use copper being excellent in both electric conductivity and heat conductivity for the lead frame. In addition, metal layer 14 may be formed from a plurality of metals, and subjected to plating on the surface thereof.

In addition, it is preferable that bus bar 17 has a larger cross-sectional area in a direction of electrical conduction than bus bar 16. With this configuration, a thermal resistance regarding heat conductivity of heat generated from semiconductor element 15 becomes smaller in bus bar 17 than in bus bar 16.

One example of the configuration in which the cross-sectional area of bus bar 17 in the direction of electrical conduction is set larger than that of bus bar 16 will be described with reference to FIG. 2. For example, as illustrated in FIG. 2, bus bar 17 is wider than bus bar 16 in the direction of electrical conduction in a plan view. In semiconductor device 11 illustrated in FIG. 2, bus bar 17 has a larger cross-sectional area in the direction of electrical conduction than bus bar 16.

It is to be noted that the cross-sectional area of bus bar 17 in the direction of electrical conduction can be made different from the cross-sectional area of bus bar 16 by changing the size in the thickness direction.

In this exemplary embodiment, another end 16B of bus bar 16 corresponds to output unit 21, so that it is connected to another device not illustrated. In this case, when bus bar 17 is formed to have a larger cross-sectional area in the direction of electrical conduction than that of bus bar 16 and connected to connection terminal 19 and metal layer 14, a lot of heat generated from semiconductor element 15 is conducted to metal layer 14 from bus bar 17. Therefore, an adverse effect caused by a conduction of a large amount of heat to an external device from semiconductor element 15 can be suppressed. In the above description, the cross-sectional area in the direction of electrical conduction is compared between bus bar 16 and bus bar 17. Regarding this point, bus bar 17 may have a larger cross-sectional area in a direction of heat conduction than that of bus bar 16.

Further, a lot of heat generated from semiconductor element 15 is conducted to metal layer 14 from bus bar 17 formed to be shorter than bus bar 16. Therefore, heat conduction property from semiconductor element 15 to the outside of semiconductor element 15 and heat dissipation property of semiconductor device 11 as a whole are enhanced.

Second Exemplary Embodiment

Next, a second exemplary embodiment of the present disclosure will be described with reference to FIG. 3.

Figure 3:
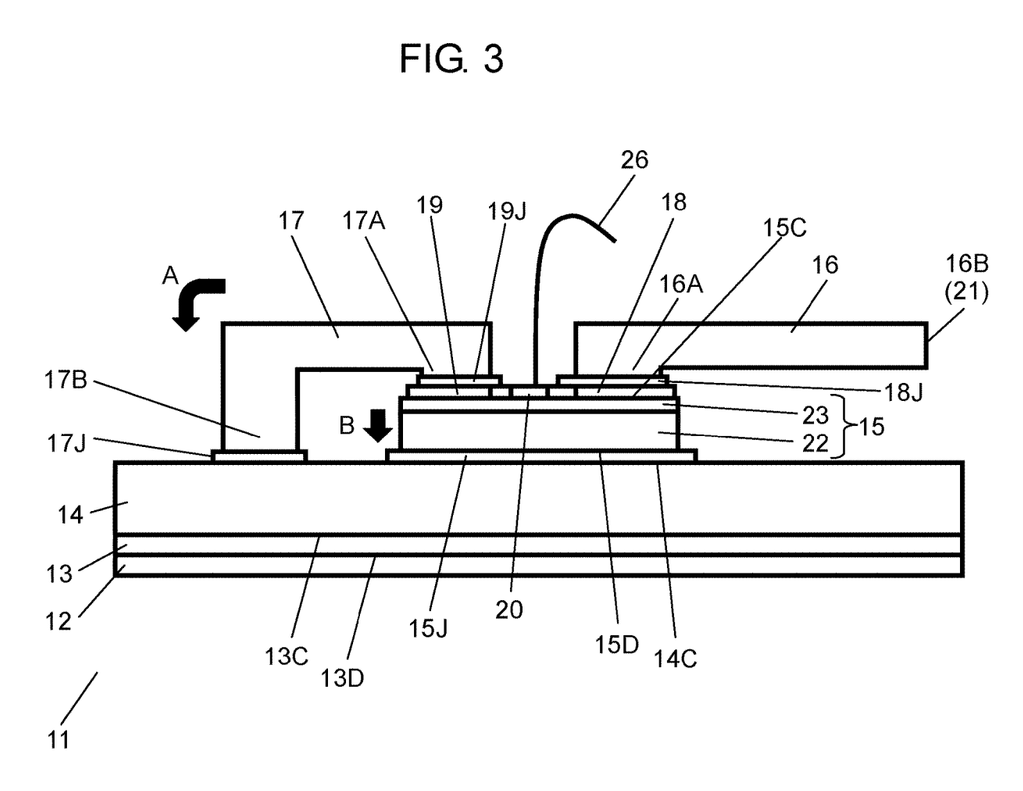
FIG. 3 is a side view illustrating a configuration of a semiconductor device according to a second exemplary embodiment of the present disclosure.

FIG. 3 is a side view illustrating a configuration of a semiconductor device according to the second exemplary embodiment of the present disclosure.

Semiconductor device 11 illustrated in FIG. 3 according to the second exemplary embodiment is configured by additionally providing insulating layer 13 and heat dissipator 12 to semiconductor device 11 described with reference to FIG. 1 according to the first exemplary embodiment. It should be noted that elements similar to those in semiconductor device 11 in FIG. 1 are given identical reference signs, and description of such elements is sometimes omitted.

Insulating layer 13 is provided such that metal layer 14 and top surface 13C of insulating layer 13 are in contact with each other. Further, heat dissipator 12 is provided so as to be in contact with bottom surface 13D of insulating layer 13. With this configuration, heat conducted to metal layer 14 from semiconductor element 15 and bus bar 17 is efficiently dissipated to the outside of semiconductor device 11.

In general, an insulating material has low heat conductivity, and if the insulating material is present in a heat conduction path, the thermal resistance of the heat conduction path increases. Heat conduction path A is constituted only by metal having high heat conductivity. Accordingly, heat conduction from connection terminal 19 to metal layer 14 through bus bar 17 is excellent, and thus heat generated from semiconductor element 15 is efficiently conducted to metal layer 14 and heat dissipator 12.

Third Exemplary Embodiment

Next, a third exemplary embodiment of the present disclosure will be described with reference to FIG. 4.

Figure 4:
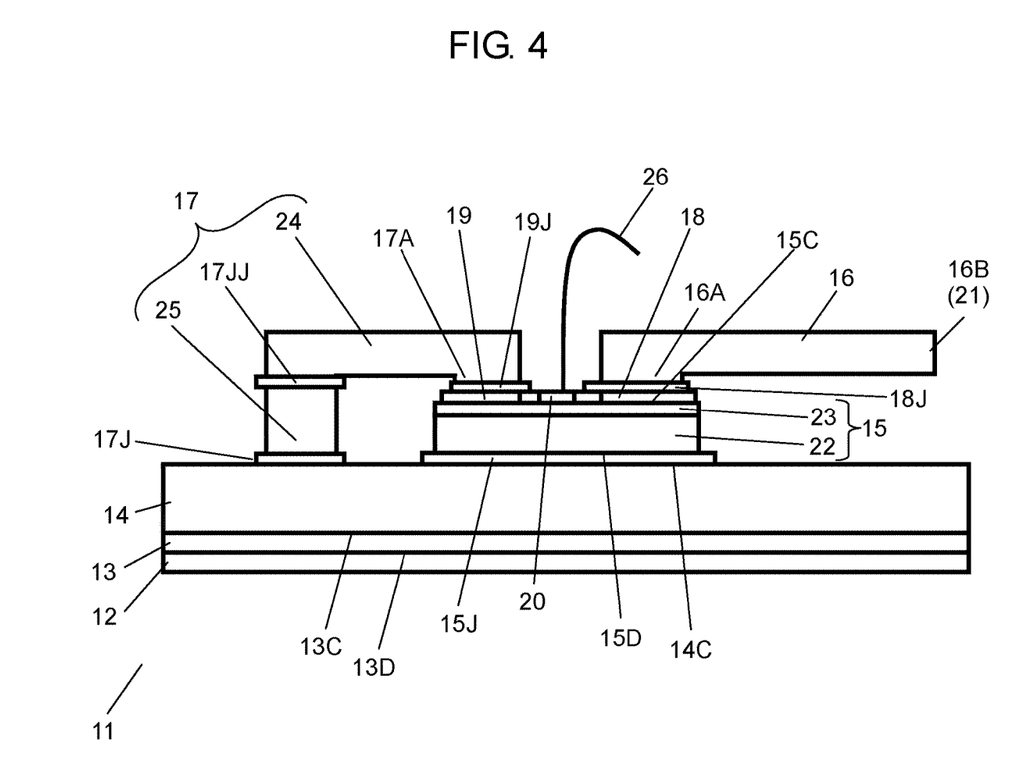
FIG. 4 is another side view illustrating a configuration of a semiconductor device according to a third exemplary embodiment of the present disclosure.

FIG. 4 is a side view illustrating a configuration of a semiconductor device according to the third exemplary embodiment of the present disclosure.

Semiconductor device 11 illustrated in FIG. 4 according to the third exemplary embodiment is different from semiconductor device 11 illustrated in FIG. 3 only in bus bar 17. The other elements are given identical reference signs to those in the second exemplary embodiment, and description of such elements is sometimes omitted.

In semiconductor device 11 illustrated in FIG. 1 and semiconductor device 11 illustrated in FIG. 2, bus bar 17 is formed into a hook shape by bending a single plate-shaped or rod-shaped conductor made of copper, for example.

As illustrated in FIG. 4, bus bar 17 in semiconductor device 11 according to the third exemplary embodiment includes horizontal bus bar 24 and vertical bus bar 25. Horizontal bus bar 24 and vertical bus bar 25 are connected to each other by joint section 17JJ. Horizontal bus bar 24 and vertical bus bar 25 may be formed into a rod shape, plate shape, columnar shape, or block shape so as to substantially linearly extend.

In other words, bus bar 17 is formed by a plurality of linearly extending conductors (horizontal bus bar 24 and vertical bus bar 25).

In FIG. 4, horizontal bus bar 24 horizontally extends and has one end 17A bent toward connection terminal 19. The configuration having a bent part such as horizontal bus bar 24 is also included in the linearly extending configuration.

As described above, bus bar 17 does not need to be bent when being formed. Therefore, horizontal bus bar 24 and vertical bus bar 25 can be formed to have any cross-sectional area, and thus, it is particularly easy to increase the cross-sectional area. In addition, bus bar 17 including horizontal bus bar 24 and vertical bus bar 25 does not have a stress caused by bending. Therefore, even if bus bar 17 receives heat from semiconductor element 15, bus bar 17 is not deformed for releasing a stress. Accordingly, joint sections 17J, 17JJ, and 19J hardly receive a mechanical stress. As a result, joint sections 17J, 17JJ, and 19J can maintain electrical reliability, thermal reliability, and mechanical reliability.

In addition, horizontal bus bar 24 and vertical bus bar 25 do not need to have the same cross-sectional area in a direction of electrical conduction and a direction of heat conduction. One of horizontal bus bar 24 and vertical bus bar 25 may have a larger or smaller cross-sectional area than the other. The balance between the heat conduction property from semiconductor element 15 through bus bar 17 and the heat conduction property from semiconductor element 15 to metal layer 14 may be adjusted by horizontal bus bar 24 or vertical bus bar 25. Accordingly, the property regarding dissipation of heat from semiconductor element 15 can easily be adjusted.

It is to be noted that the term "bonding" in the present disclosure includes a configuration where elements are bonded by a joint section such as a solder. For example, even when semiconductor element 15 is mounted on metal layer 14 by joint section 15J such as a solder with semiconductor element 15 and metal layer 14 being not in direct contact with each other, semiconductor element 15 and metal layer 14 are bonded to each other.

According to the present disclosure, heat generated on an electrode (connection terminal 18, connection terminal 19, or connection terminal 20) disposed on the surface (top surface 15C) opposite to mounting surface 15D of semiconductor element 15 is conducted to metal layer 14 being in contact with mounting surface 15D of semiconductor element 15 through semiconductor element 15 and bus bar 17. In addition, since the mounting portion (mounting surface 15D) of semiconductor element 15 and bus bar 17 are at the identical potential, the mounting portion (mounting surface 15D) of semiconductor element 15 and bus bar 17 do not need to be insulated from each other. Therefore, the mounting portion of semiconductor element 15 and the joint portion between bus bar 17 and metal layer 14 can be disposed to be closely adjacent to each other. Thus, bus bar 17 can be formed to be short in shape, so that the thermal resistance can be reduced. Accordingly, heat generated on the electrode (connection terminal 18, connection terminal 19, or connection terminal 20) of the semiconductor element can efficiently be conducted to metal layer 14, and therefore, the heat dissipation property of the semiconductor element is enhanced.

INDUSTRIAL APPLICABILITY

The semiconductor device according to the present disclosure has an effect of having efficient heat dissipation property, and is useful for various electronic devices.

REFERENCE MARKS IN THE DRAWINGS

1 base plate
2 insulating layer
3 heat sink
4, 5 insulator
7 semiconductor element
6, 8, 16, 17 bus bar
9, 10 end
11 semiconductor device
12 heat dissipator
13 insulating layer
13C top face
13D bottom surface
14 metal layer
14C mounting surface
15 semiconductor element
15C top surface
15D mounting surface
15J, 16J, 17J, 17JJ, 18J, 19J joint section
16A, 17A one end
16B, 17B another end
18, 19, 20 connection terminal
21 output unit
22 substrate
23 nitride semiconductor layer
24 horizontal bus bar
25 vertical bus bar
A, B heat conduction path

The invention claimed is:

1. A semiconductor device comprising:
a metal layer which is a conductor;
a semiconductor element mounted on a first surface of the metal layer;
a first connection terminal provided on the semiconductor element;
a second connection terminal provided on the semiconductor element;
a third connection terminal provided on the semiconductor element;
a first bus bar bonded to the first connection terminal, the first bus bar formed as a single conductive member; and
a second bus bar bonded to the second connection terminal,
wherein a first surface of the semiconductor element is bonded to the first surface of the metal layer,
the first connection terminal, the second connection terminal, and the third connection terminal are disposed on a second surface of the semiconductor element,
one end of the first bus bar is bonded to the first connection terminal,
another end of the first bus bar is an output unit which is exposed to the outside of the semiconductor device,
one end of the second bus bar is bonded to the second connection terminal,
another end of the second bus bar is bonded to the metal layer, and
the first surface of the semiconductor element and the second bus bar are at an identical potential, and
a cross-sectional area of the second bus bar in a direction of electrical conduction is larger than a cross-sectional area of the first bus bar in a direction of electrical conduction.

2. The semiconductor device according to claim 1, further comprising:
an insulating layer provided on a second surface of the metal layer; and
a heat dissipator provided to the insulating layer,
wherein a first surface of the insulating layer is in contact with the metal layer, and
a second surface of the insulating layer is in contact with the heat dissipator.

3. The semiconductor device according to claim 1,
wherein the semiconductor element is constituted by a gallium nitride-based transistor,
the first connection terminal is a drain terminal,
the second connection terminal is a source terminal, and
the third connection terminal is a gate terminal.

4. The semiconductor device according to claim 1, wherein the metal layer is a lead frame in which a wiring pattern is formed.

5. The semiconductor device according to claim 1, wherein
the second bus bar includes a plurality of linearly extending conductors and joint section,
a first conductor is one of the plurality of linearly extending conductors and extends horizontally with respect to the first surface of the semiconductor element,
a second conductor is another one of the plurality of linearly extending conductors and extends vertically with respect to the first surface of the semiconductor element, and
the first conductor and the second conductor are connected to each other by the joint section.

6. The semiconductor device according to claim 5, wherein the first conductor is a rod shape or plate shape.

7. The semiconductor device according to claim 5, wherein the second conductor is a rod shape or plate shape.

* * * * *